United States Patent [19]
Weber et al.

[11] Patent Number: 6,078,190
[45] Date of Patent: Jun. 20, 2000

[54] THRESHOLD LOGIC WITH IMPROVED SIGNAL-TO-NOISE RATIO

[75] Inventors: Werner Weber, München; Roland Thewes, Gröbenzell; Andreas Luck, München, all of Germany

[73] Assignee: Siemens Aktiengesellschaft, Munich, Germany

[21] Appl. No.: 09/117,760

[22] PCT Filed: Feb. 27, 1997

[86] PCT No.: PCT/DE97/00355

§ 371 Date: Aug. 6, 1998

§ 102(e) Date: Aug. 6, 1998

[87] PCT Pub. No.: WO97/33372

PCT Pub. Date: Sep. 12, 1997

[30] Foreign Application Priority Data

Mar. 8, 1996 [DE] Germany ............... 196 09 078

[51] Int. Cl.[7] .................. H03K 19/23; H03K 19/094
[52] U.S. Cl. .................. 326/36; 326/35; 326/36; 326/112; 326/119; 706/26; 706/33; 706/41; 706/42; 706/43
[58] Field of Search .................. 326/35, 36, 112, 326/119; 706/26, 33, 41, 42, 43

[56] References Cited

U.S. PATENT DOCUMENTS

| 4,843,264 | 6/1989 | Galbraith . | |
|---|---|---|---|
| 5,331,215 | 7/1994 | Allen et al. . | |
| 5,469,085 | 11/1995 | Shibata et al. . | |
| 5,594,372 | 1/1997 | Shibata et al. ............. | 326/121 |
| 5,608,340 | 3/1997 | Shibata et al. ............. | 326/36 |
| 5,661,421 | 8/1997 | Ohmi et al. ............. | 327/63 |

FOREIGN PATENT DOCUMENTS

| 0 657 934 A1 | 6/1995 | European Pat. Off. . |
| WO 95/35548 | 12/1995 | WIPO . |

*Primary Examiner*—Michael Tokar
*Assistant Examiner*—V. Tan
*Attorney, Agent, or Firm*—Hill & Simpson

[57] ABSTRACT

The threshold value logic has a non-inverting circuit path (S) that and an inverting circuit path (S') are connected to at least one comparative weighting subcircuit (BC, BS). The non-inverting circuit path and the inverting circuit path preferably are of identical construction and each contain at least one neuron transistor (NT1, NT1'). The corresponding neuron transistor gates in the non-inverting circuit path and in the inverting circuit path are driven inversely with respect to one another.

2 Claims, 1 Drawing Sheet

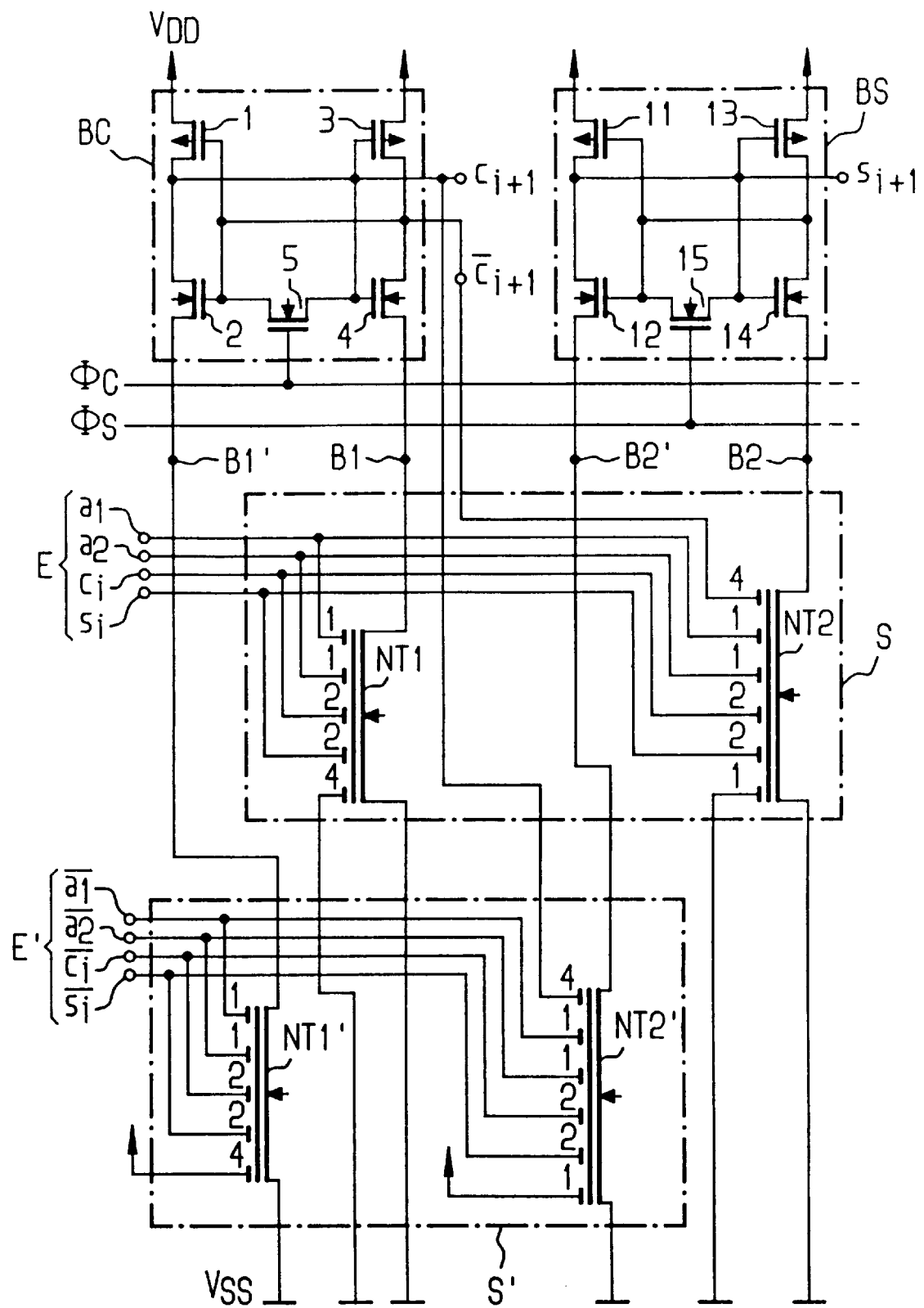

THRESHOLD LOGIC WITH IMPROVED SIGNAL-TO-NOISE RATIO

BACKGROUND OF THE INVENTION

Logic functions can be realized for example by transistor-transistor logic (TTL), by emitter-coupled logic (ECL), by complementary MOS logic (CMOS), as well as by so-called threshold value logic with neuron MOS transistors. Threshold value logic modules can be used to realize not only simple logic combinations, but also, for example, full adders, multipliers and more complex units. Essential advantages of threshold value logic primarily reside in the small number of transistors required and in the comparatively high operating speed. The susceptibility to interference is usually greater in the case of known threshold value logic circuits than in the case of other known types of logic.

The international patent application WO 95/35548 discloses, in particular in FIGS. 21 and 22, a circuit having a weighting circuit, which supplies two complementary output signals, having a first and a second circuit path, which each contain a neuron transistor for the indirect connection of a respective comparison terminal to reference-ground potential, and having neuron transistors to whose gates inverse input signals are applied.

A weighting circuit is disclosed in U.S. Pat. No. 4,843,264, for example.

The object of the invention, then, is to specify a threshold value logic circuit whose signal-to-noise ratio is improved relative to conventional threshold value logic circuits.

In general terms the present invention is a threshold value logic circuit, that comprises a weighting subcircuit for the forming a carry; a second weighting subcircuit for forming of a summation signal; a non-inverting circuit path having a first neuron transistor and a second neuron transistor and an inverting circuit path having a further first neuron transistor and a further second neuron transistor; a weighting terminal of the first weighting subcircuit for forming the carry connected to reference-ground potential via the first neuron transistor and a comparison terminal of the first weighting subcircuit connected to reference-ground potential via the further first transistor; a weighting terminal of the second weighting subcircuit for forming of the summation signal connected to reference-ground potential via the second neuron transistor and a comparison terminal of the second weighting subcircuit for forming the summation signal connected to reference-ground potential via the further second neuron transistor; a first gate of the first neuron transistor connected to a multiplicand, a second gate of the first neuron transistor connected to a multiplication factor, a third gate of the first neuron transistor connected to a carry signal of a preceding stage, a fourth gate of the first neuron transistor connected to a summation signal of the preceding stage and a fifth gate of the first neuron transistor connected to reference-ground potential; a first gate of the second neuron transistor connected to an inverted carry signal, a second gate of the neuron transistor connected to the multiplicand, a third gate of the second neuron transistor connected to the multiplication factor, a fourth gate of the second neuron transistor connected to the carry signal of the preceding stage, a fifth gate of the second neuron transistor connected to the summation signal of the preceding stage and a sixth gate of the second neuron transistor connected to reference-ground potential; gates of the further first and further second neuron transistors being supplied with signals, which are inverse of signals present at corresponding gates of the first and second neuron transistors;

at least one of the weighting subcircuits is constructed with first and second p-channel MOS transistors and first, second and third n-channel MOS transistors, the first and second p-channel transistors and the first and second n-channel transistors, respectively forming first and second inverter stages, a respective output of one inverter stage of the first and second inverter stage being fed back to a respective input of the other inverter stage of the first and second inverter stages, and wherein gates of the first and second n-channel MOS transistors of the first and second inverter stages are connected together via the third n-channel MOS transistor.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single FIGURE depicts the threshold logic circuit of the present invention.

DESCRIPTION OF THE PREFERRED EMBODIMENTS

The single FIGURE shows threshold value logic according to the present invention using the example of a multiplier. The multiplier has a non-inverting circuit path S, an inverting circuit path S', a weighting subcircuit BC for a carry $c_{i+1}$ and $\bar{c}_{i+1}$ and a further weighting subcircuit BS for a summation result $s_{i+1}$.

The weighting subcircuit BC has two p-channel transistors 1 and 3 and three n-channel transistors 2, 4 and 5, the two transistors 1 and 2 and the two transistors 3 and 4 being connected in series and in each case forming an inverter stage, and the gates of the transistors 2 and 4 being connected via the transistor 5. A terminal of the transistor 1 and of the transistor 3 is in each case connected to VDD. A terminal of the transistor 2 constitutes a comparison terminal B1' of the circuit BC and a terminal of the transistor 4 constitutes a weighting terminal B1 of the circuit BC. The connecting node between the transistors 1 and 2 is cross-coupled to the gates of the transistors 3 and 4 and the connecting node between the transistors 3 and 4 is cross-coupled to the gates of the transistors 1 and 2, the connecting node between the transistors 1 and 2 carrying the carry signal $c_{i+1}$ and the connecting node between the transistors 3 and 4 carrying the inverted carry signal $\bar{c}_{i+1}$. The gate of the transistor 5 is driven by the clock signal $\Phi_c$ and enables resetting of the circuit BC. The same applies correspondingly to the weighting subcircuit BS, which has two p-channel transistors 11, 13 and three n-channel transistors 12, 14 and 15, a junction point between the transistors 11 and 12 carrying a summation output signal $S_{i+1}$, a terminal of the transistor 12 constituting a comparison terminal B2', a terminal of the transistor 14 constituting a terminal B2 of the weighting circuit BS and the gate of the transistor 15 being able to be driven by a clock signal $\Phi_s$.

By way of example, the circuit path S in this case contains a neuron transistor NT1 and a neuron transistor NT2, a first terminal of the neuron transistor NT1 being connected to the weighting terminal B1 and a second terminal of the neuron transistor NT1 being connected to reference-ground potential VSS, and a first terminal of the neuron transistor NT2 being connected to the weighting terminal B2 and a second terminal of the neuron transistor NT2 likewise being connected to reference ground potential VSS. Non-inverting inputs E, which comprise multiplicand $a_1$, multiplication factor $a_2$, carry of the preceding stage $c_i$ and sum $s_i$ of the preceding stage in the case of the multiplier, are connected to gates of the neuron transistors NT1 and NT2. Furthermore, a gate of the neuron transistor NT1 is connected to reference-ground potential VSS. In the case of the transistor NT2, a gate is connected to the output for the inverted carry signal $\bar{c}_{i+1}$ and a gate of the transistor NT2 is connected to reference-ground potential VSS. The gates of the neuron transistors may be directed differently, as in the case of the multiplier. The inverting circuit path S' is basically constructed in exactly the same way as the circuit path S. The only differences are that gates of the transistors NT1' and NT2' are not connected to inputs E but rather to inputs E' which are the inverse thereof, that the gates which are connected to reference-ground potential in the circuit path S are connected to VDD in the circuit path S', and that the terminals of the transistors NT1' and NT2' are not connected to the weighting terminals B1 and B2, respectively, but rather to the weighting terminals B1' and B2' of the weighting subcircuits BC and BS.

At least one weighting subcircuit, a non-inverting circuit path S having at least one neuron transistor and an inverting circuit path S', preferably of identical construction, having at least one neuron transistor are provided in the general case of threshold value logic according to the invention, a first terminal of the at least one neuron transistor of the circuit path S being connected indirectly or directly to a first weighting terminal and a second terminal of the neuron transistor of the circuit path S being connected indirectly or directly to reference-ground potential, and a first terminal of the at least one neuron transistor of the inverting circuit path S' being connected indirectly or directly to a comparison terminal of the weighting circuit and a second terminal of the at least one neuron transistor of the inverting circuit path S' being connected indirectly or directly to reference-ground potential. In the case of indirect connection, a neuron transistor is connected for example via a "customary" MOS transistor or a further neuron transistor. The gates of the inverting circuit path S' are supplied with signals which are the inverse of the signals at the gates of the at least one neuron transistor of the non-inverting circuit path S, provided that a correction voltage is not applied to the respective gate.

The gates to which the correction voltages VDD or VSS are applied in the above example serve to shift the switching threshold and can also be driven by correction voltages other than VDD or VSS depending on the desired logic function. In principle, differently constructed circuit paths S and S' are also possible by means of corresponding selection of the correction voltages.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A threshold value logic circuit, comprising:

a first weighting subcircuit for forming a carry;

a second weighting subcircuit for forming a summation signal;

a non-inverting circuit path having a first neuron transistor and a second neuron transistor and an inverting circuit path having a further first neuron transistor and a further second neuron transistor;

a weighting terminal of the first weighting subcircuit for forming the carry connected to reference-ground potential via the first neuron transistor and a comparison terminal of the first weighting subcircuit connected to reference-ground potential via the further first transistor;

a weighting terminal of the second weighting subcircuit for forming the summation signal connected to reference-ground potential via the second neuron transistor and a comparison terminal of the second weighting subcircuit for forming the summation signal connected to reference-ground potential via the further second neuron transistor a first gate of the first neuron transistor connected to a multiplicand, a second gate of the first neuron transistor connected to a multiplication factor, a third gate of the first neuron transistor connected to a carry signal of a preceding stage, a fourth gate of the first neuron transistor connected to a summation signal of the preceding stage and a fifth gate of the first neuron transistor connected to reference-ground potential;

a first gate of the second neuron transistor connected to an inverted carry signal, a second gate of the second neuron transistor connected to the multiplicand, a third gate of the second neuron transistor connected to the multiplication factor, a fourth gate of the second neuron transistor connected to the carry signal of the preceding stage, a fifth gate of the second neuron transistor connected to the summation signal of the preceding stage and a sixth gate of the second neuron transistor connected to reference-ground potential;

gates of the further first and further second neuron transistors being supplied with signals, which are inverse of signals present at corresponding gates of the first and second neuron transistors.

2. The threshold value logic circuit as claimed in claim 1, wherein at least one of the weighting subcircuits is constructed with first and second p-channel MOS transistors and first, second and third n-channel MOS transistors, the first and second p-channel transistor and the first and second n-channel transistor, respectively forming first and second inverter stages, a respective output of one inverter stage of the first and second inverter stages being fed back to a respective input of the other inverter stage of the first and second inverter stages, and wherein gates of the first and second n-channel MOS transistors of the first and second inverter stages are connected together via the third n-channel MOS transistor.

* * * * *